(12) United States Patent
Kim et al.

(10) Patent No.: US 7,957,199 B2
(45) Date of Patent: *Jun. 7, 2011

(54) METHOD OF ERASING IN NON-VOLATILE MEMORY DEVICE

(75) Inventors: Doo-Gon Kim, Gyeonggi-do (KR);
Ki-Tae Park, Gyeonggi-do (KR);
Yeong-Taek Lee, Seoul (KR)

(73) Assignee: Samsung Electronics Co., Ltd.,
Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/833,098

(22) Filed: Jul. 9, 2010

(65) Prior Publication Data

US 2010/0271883 A1    Oct. 28, 2010

Related U.S. Application Data

(63) Continuation of application No. 12/136,968, filed on Jun. 11, 2008, now Pat. No. 7,778,085.

(30) Foreign Application Priority Data

Jun. 11, 2007 (KR) .............................. 2007-0056792

(51) Int. Cl.
*G11C 16/06* (2006.01)

(52) U.S. Cl. ............ 365/185.22; 365/185.2; 365/185.24; 365/185.29

(58) Field of Classification Search ............. 365/185.22, 365/185.2, 185.24, 185.29, 185.17–185.18, 365/210.1

See application file for complete search history.

(56) References Cited

U.S. PATENT DOCUMENTS

| 7,266,019 | B2 | 9/2007 | Taoka et al. |
| 7,535,764 | B2 | 5/2009 | Chin et al. |
| 7,768,835 | B2 * | 8/2010 | Goda ........................ 365/185.22 |
| 7,778,085 | B2 * | 8/2010 | Kim et al. ................ 365/185.22 |
| 2006/0139997 | A1 | 6/2006 | Park et al. |

FOREIGN PATENT DOCUMENTS

| JP | 07-050096 | 2/1995 |
| JP | 11-306785 | 11/1999 |
| JP | 2004-127346 | 4/2004 |
| KR | 2003-0089316 | 11/2003 |
| KR | 2006-0074179 | 7/2006 |
| KR | 2006-0110755 | 10/2006 |

* cited by examiner

*Primary Examiner* — David Lam
(74) *Attorney, Agent, or Firm* — Muir Patent Consulting, PLLC

(57) ABSTRACT

An erasing method in a nonvolatile memory device is disclosed. The method includes post-programming dummy memory cells; verifying whether threshold voltages of the dummy memory cells are greater than or equal to a first voltage; post-programming normal memory cells; and verifying whether threshold voltages of the normal memory cells are greater than or equal to a second voltage. The first voltage is different from the second voltage, and the post-programming of the dummy memory cells comprises: applying a program voltage to a plurality of dummy word lines coupled to the dummy memory cells to post-program the dummy memory cells; and applying a pass voltage to a plurality of normal word lines coupled to the normal memory cells so that the normal memory cells are not post-programmed.

24 Claims, 9 Drawing Sheets

| Signal | DWL Post PGM | WL[31:0] Post PGM | DWL Verify | WL[31:0] Verify |
|---|---|---|---|---|
| DWL1,2 | Vpgm | Vpass | Vr1 | Vread |
| WL[31:0] | Vpass | Vpgm | Vread | Vr2 |

FIG. 6

| Signal | DWL1 Post PGM | DWL2 Post PGM | WL[31:0] Post PGM | DWL1 Verify | DWL2 Verify | WL [31:0] Verify |
|---|---|---|---|---|---|---|
| DWL1 | Vpgm | Vpass | Vpass | Vr1' | Vread | Vread |
| DWL2 | Vpgm | Vpgm | Vpass | Vread | Vr2' | Vread |
| WL [31:0] | Vpgm | Vpass | Vpgm | Vread | Vread | Vr3' |

METHOD OF ERASING IN NON-VOLATILE MEMORY DEVICE

CROSS-REFERENCE TO RELATED PATENT APPLICATIONS

This application claims the benefit of priority and is a Continuation of U.S. patent application Ser. No. 12/136,968 filed on Jun. 11, 2008, now U.S. Pat. No. 7,778,085, which claims the benefit of Korean Patent Application No. 10-2007-0056792 filed on Jun. 11, 2007, in the Korean Intellectual Property Office, the disclosure of each of which is incorporated herein in its entirety by reference.

BACKGROUND

1. Technical Field

This disclosure relates to a semiconductor memory device, and more particularly, to a non-volatile semiconductor memory device.

2. Description of the Related Art

Semiconductor memory devices can be largely categorized into a volatile memory devices, such as dynamic random access memory (DRAM) and static random access memory (SRAM), in which stored data may be lost and data can be quickly read and write; and non-volatile memory devices in which stored data can be retained but data is read and write slower than in the volatile memory devices. Nonvolatile memory devices can be categorized into read only memory (ROM), programmable ROM (PROM), erasable PROM (EPROM) and electrically EPROM (EEPROM). EEPROM or flash EEPROM (hereinafter referred to as "flash memory") data can be erased and a stack type gate structure in which a floating gate and a control gate are integrated.

A memory array of flash memory can have multiple strings as basic units. Each string has a structure in which a select transistor and multiple memory cells are connected in series. In a flash memory device with such a structure, the speed of programming a memory cell connected to a word line adjacent to a drain select line and a memory cell connected to a word line adjacent to a source select line can be degraded. To solve this problem, a structure in which a memory cell connected to a dummy word line is added to each string has been introduced.

An erasing operation of flash memory device can be largely categorized into pre-programming, main-erasing, and post-programming. Pre-programming is performed under the same bias conditions as in a normal programming operation in order to prevent memory cells from being excessively unnecessarily erased during subsequent erasing. All memory cells that are to be erased are pre-programmed. After pre-programming, main-erasing is performed so that all memory cells in a sector can have an "on" cell state. Once main-programming begins, all of the memory cells in the sector are erased at the same time. Lastly, post-programming is performed in order to recover memory cells that were excessively erased due to main-erasing. Post-programming is performed in a similar manner that pre-programming is performed, except for the bias conditions.

In the case of a conventional flash memory device with dummy word lines, post-programming is indiscriminately performed on dummy memory cells connected to the dummy word lines and normal memory cells connected to the normal word lines. That is, the normal memory cells and the dummy memory cells have the same threshold voltage as the result of performing post-programming. In this case, the dummy memory cells that are to be turned off may be turned on during programming after erasing, thus preventing the normal memory cells from being programmed.

SUMMARY

An embodiment includes an erasing method of post-programming in a nonvolatile memory device. The method includes post-programming dummy memory cells; verifying whether threshold voltages of the dummy memory cells are greater than or equal to a first voltage; post-programming normal memory cells; and verifying whether threshold voltages of the normal memory cells are greater than or equal to a second voltage. The first voltage is different from the second voltage.

Another embodiment includes an erasing method of post-programming in a nonvolatile memory device including post-programming dummy memory cells; post-programming normal memory cells; verifying whether threshold voltages of the each of the dummy memory cells are greater than or equal to at least one corresponding first voltage; verifying whether threshold voltages of the normal memory cells are greater than or equal to a second voltage; post-programming a group of memory cells including dummy memory cells that were not verified as having threshold voltages greater than or equal to the at least one corresponding first voltage and normal memory cells that were not verified as having threshold voltages greater than or equal to the second voltage. Each of the at least one corresponding first voltage is different from the second voltage.

BRIEF DESCRIPTION OF THE DRAWINGS

The above and other features and advantages will become more apparent by describing embodiments in detail with reference to the attached drawings in which:

FIG. 6 is a table illustrating voltage conditions when post-programming is performed according to the method of FIG. 5;

DETAILED DESCRIPTION

Figure 1:
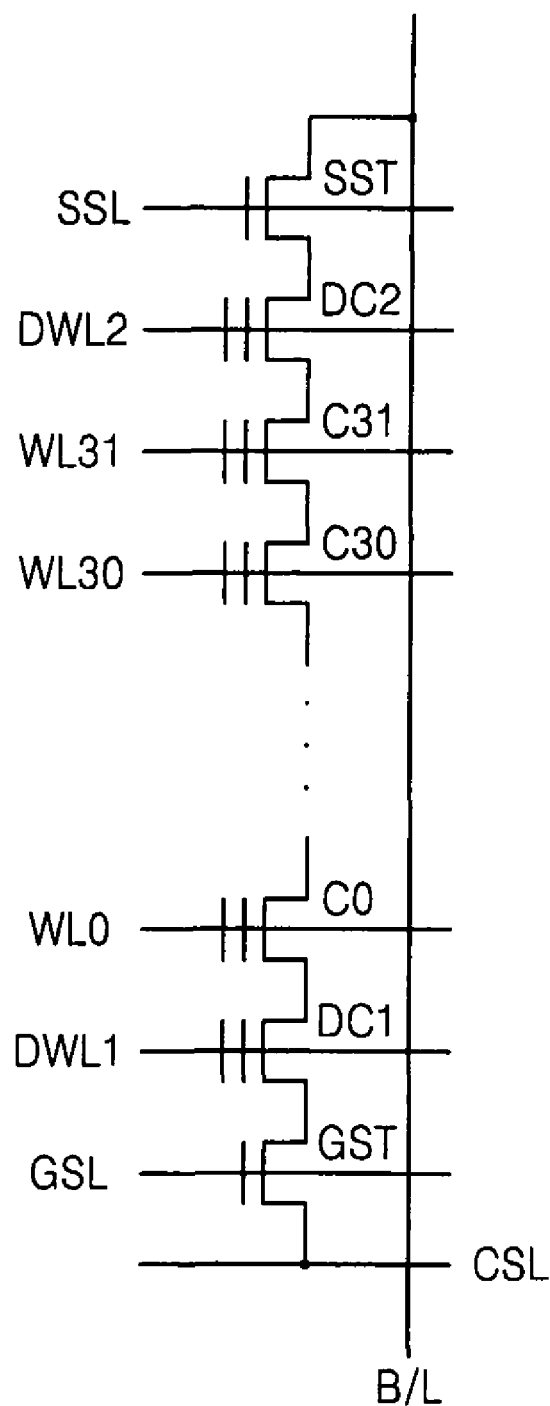
FIG. 1 is a circuit diagram of a nonvolatile semiconductor memory device according to an embodiment.

Embodiments will now be described more fully with reference to the accompanying drawings. Like reference numerals denote like elements throughout the drawings.

FIG. 1 is a circuit diagram of a non-volatile semiconductor memory device according to an embodiment. FIG. 1 illustrates a string 100 of a nonvolatile semiconductor memory device. The string 100 of the nonvolatile semiconductor memory device, and particularly, a flash memory device includes a first select transistor GST, a second select transistor SST, a first dummy memory cell DC1, a second dummy memory cell DC2, and multiple normal memory cells C0, . . . , C30, C31. Although FIG. 1 illustrates 32 memory cells connected in series, it would be apparent to those of ordinary skill in the art that any number of memory cells can be connected in series in an embodiment.

A gate line of a first select transistor GST is a first select line GSL, a gate line of a second select transistor SST is a second select line SSL, and the gate lines of normal memory cell C0, . . . , C31 are normal word lines WL0, . . . , WL31, respectively. A gate line of a first dummy memory cell DC1 is a first dummy word line DWL1, and the gate line of second dummy memory cell DC2 is a second dummy word line DWL2.

Figures 2, 3:
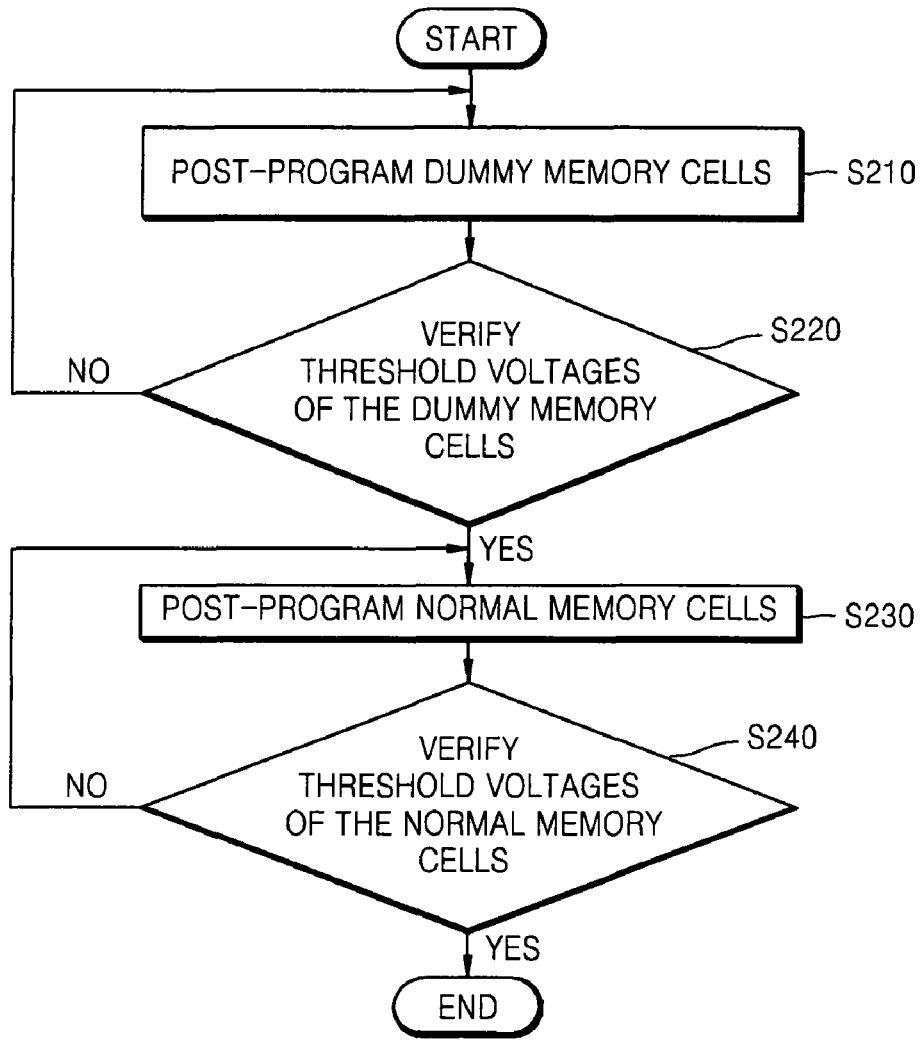
FIG. 2 is a flowchart illustrating a method of erasing in a nonvolatile memory device according to an embodiment.
FIG. 3 is a table illustrating voltage conditions when post-programming is performed according to the method of FIG. 2.

FIG. 2 is a flowchart illustrating a method of erasing in a nonvolatile memory device according to an embodiment. In particular, FIG. 2 illustrates a method of post-programming a nonvolatile memory device which will be described with reference to FIG. 1. First, post-programming is performed on dummy memory cells DC1 and DC2 that are respectively connected to dummy word lines DWL1 and DW2 without post-programming normal memory cells C0, . . . , C31 in S210. After post-programming of the dummy memory cells DC1 DC2 is completed, it is verified whether post-programming was successfully performed on the dummy memory cells DC1 and DC2. For example, whether the threshold voltages of the dummy memory cells DC1 and DC2 are greater than or equal to a first voltage is verified in S220. The first voltage is the threshold voltage that is to be achieved by post-programming the dummy memory cells DC1 and DC2.

If it is determined in S220 that the threshold voltages of the dummy memory cells DC1 and DC2 are not greater than or equal to the first voltage, post-programming is again performed on the dummy memory cells DC1 and DC2 in S210.

If it is determined in S220 that the threshold voltages of the dummy memory cells DC1 and DC2 are greater than or equal to the first voltage, the normal memory cells C0, . . . , C31 are post-programmed in S230. After post-programming of the normal memory cells C0, . . . , C31 is completed, whether the post-programming was successfully performed is verified in S240. For example, whether the threshold voltages of the normal memory cells C0, . . . , C31 are greater than or equal to a second voltage is verified in S240. The second voltage is the threshold voltage that is to be achieved by post-programming the normal memory cells C0, . . . , C31. In an embodiment, the first voltage is higher than the second voltage.

If it is determined in S240 that the threshold voltages of the normal memory cells C0, . . . , C31 are not greater than or equal to the second voltage, the normal memory cells C0, . . . , C31 are again post-programmed in S230.

Although the phrase greater than or equal to is used in reference to a verification of a threshold voltage, the threshold voltages can be less than a desired threshold voltage. For example, if a particular memory cell conducts when a signal on the associated word line is less than the threshold voltage, then the verification of the threshold voltage of that memory cell can include verifying that its threshold voltage is less than or equal to the desired threshold voltage.

FIG. 3 is a table illustrating an example of voltage conditions when post-programming is performed according to the method of FIG. 2. Referring to FIGS. 1 through 3, when the dummy memory cells DC1 and DC2 are post-programmed in S210, a program voltage Vpgm is applied to the dummy word lines DWL1 and DWL2 and a pass voltage Vpass is applied to the normal word lines WL0, . . . , WL31. The program voltage Vpgm is a voltage, e.g., 25 V, which is applied to a word line connected to the gate of a memory cell that is to be post-programmed. The pass voltage Vpass is a voltage, e.g., 8 V, which is to be applied to a word line connected to the gate of a memory cell that is not post-programmed.

When it is determined whether the threshold voltages of the dummy memory cells DC1 and DC2 are greater than or equal to the first voltage in S220, a first voltage Vr1 is applied to the dummy word lines DWL1 and DWL2 and a third voltage Vread is applied to the normal word lines WL0, . . . , WL31. In an embodiment, the third voltage Vread that is applied to word lines that are not to be verified is higher than the first voltage Vr1. For example, the third voltage Vread may be 6.5 V.

After the verification of the dummy memory cells DC1, DC2 is completed, the normal memory cells C0, . . . , C31 are post-programmed in S230. The program voltage Vpgm is applied to the normal word lines WL0, . . . , WL31 connected to the normal memory cells C0, . . . , C31 and the pass voltage Vpass is applied to the dummy word lines DWL1 and DWL2. In an embodiment, the third voltage Vread is higher than the second voltage Vr2.

Figure 4:
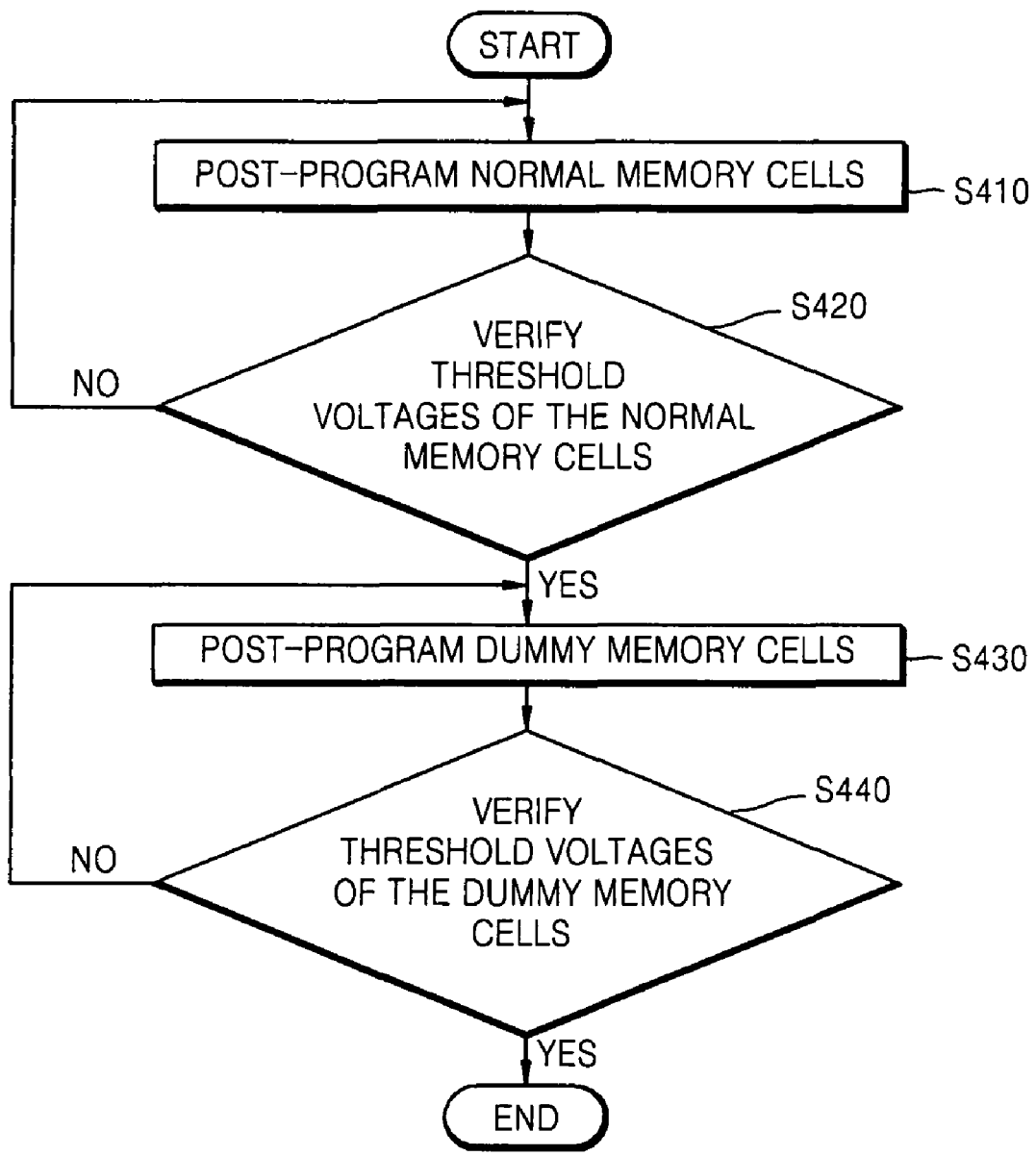
FIG. 4 is a flowchart illustrating a method of erasing in a nonvolatile memory device according to another embodiment.

FIG. 4 is a flowchart illustrating a method of erasing in a nonvolatile memory device according to another embodiment. Referring to FIGS. 1, 2, and 4, the method of FIG. 4 is performed in the opposite order that the method of FIG. 2 is performed. That is, in the method of FIG. 2, the dummy memory cells DC1 DC2 are first post-programmed in S210 and then verified in S220. Thereafter, the normal memory cells C0, . . . , C31 are post-programmed in S230 and then verified in S240. However, in the method of FIG. 4, the normal memory cells C0, . . . , C31 are first post-programmed in S410, and whether the threshold voltages of the normal memory cells C0, . . . , C31 are greater than or equal to the second voltage is verified in S420. After the normal memory cells C0, . . . , C31 are post-programmed and verified, the dummy memory cells DC1 and DC2 are post-programmed in S430 and then whether the threshold voltages of the dummy memory cells DC1 and DC2 are greater than or equal to the first voltage is verified in S440. The operations of the method of FIG. 4 are the same as those of the method of FIG. 2 and a detailed description thereof will be omitted.

Figure 5:
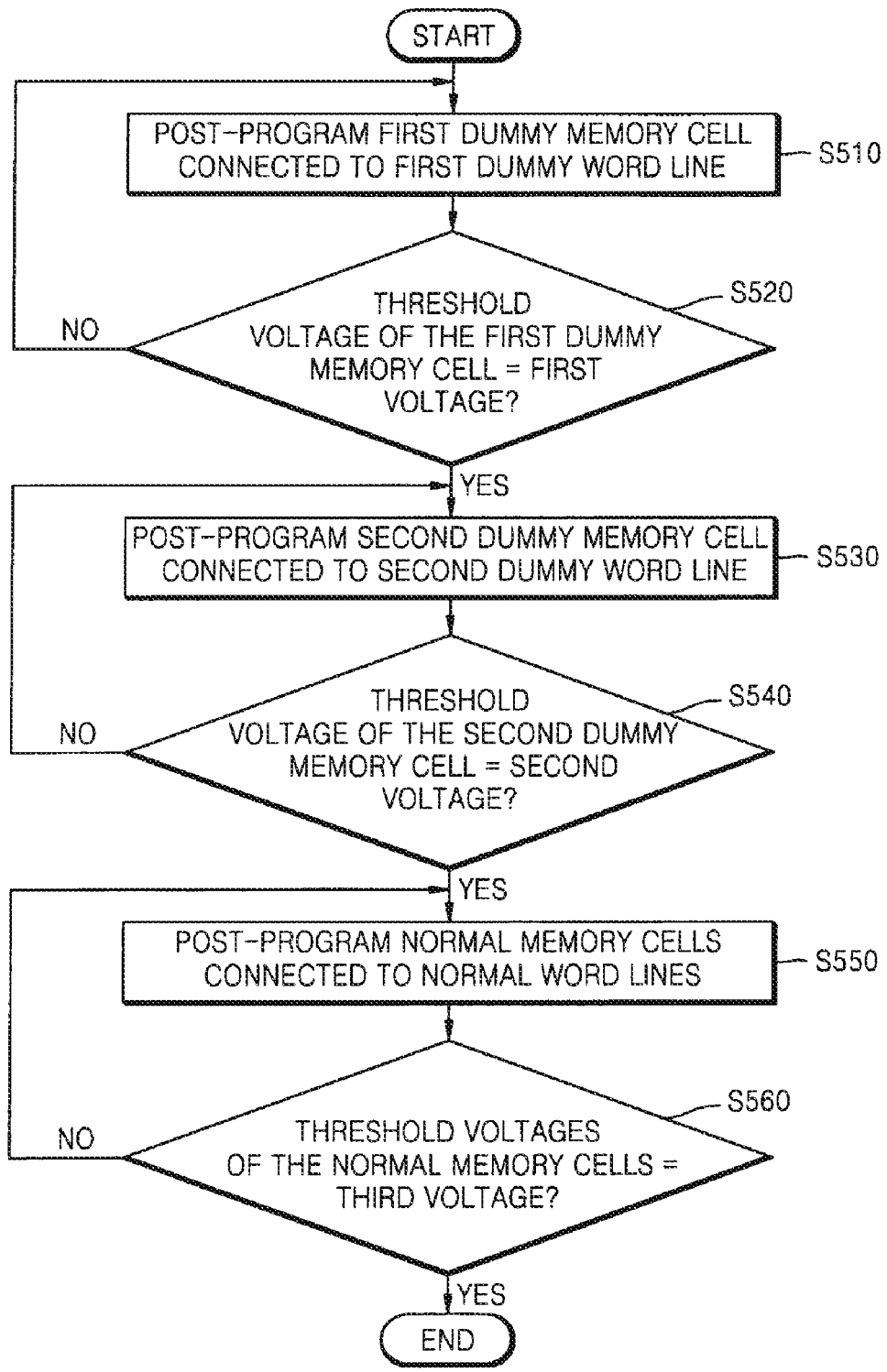
FIG. 5 is a flowchart illustrating a method of erasing in a nonvolatile memory device according to another embodiment.

FIG. 5 is a flowchart illustrating a method of erasing in a nonvolatile memory device according to another embodiment. FIG. 6 is a table illustrating an example of voltage conditions when post-programming is performed according to the method of FIG. 5. Referring to FIGS. 1, 5 and 6, in the embodiment of FIG. 5, post-programming is performed so that each of the dummy memory cells DC1 and DC2 has different threshold voltages. That is, the first dummy memory cell DC1 connected to the first dummy word line DWL1 is first post-programmed in S510. The program voltage Vpgm is applied to the first dummy word line DWL1 and the pass voltage Vpass is applied to the second dummy word line DWL2 and the normal word lines WL0, . . . , WL31. After post-programming is completed, whether the threshold voltage of the first dummy memory cell DC1 is greater than or equal to a first voltage Vr1' is verified in S520. That is, the first voltage Vr1' is applied to the first dummy word line DWL1, and a fourth voltage Vread is applied to the second dummy word line DWL2 and the normal word lines WL0, ..., WL31. In an embodiment, the fourth voltage Vread can be equal to the third voltage Vread described with reference to FIG. 3.

If it is determined in S520 that the threshold voltage of the first dummy memory cell DC1 is not greater than or equal to the first voltage Vr1', the first dummy memory cell DC1 is post-programmed again in S510. If it is determined in S520 that the threshold voltage of the first dummy memory cell DC1 is greater than or equal to the first voltage Vr1', the second dummy memory cell DC2 is post-programmed in S530.

When the second dummy memory cell DC1 is post-programmed in S530, the program voltage Vpgm is applied to the second dummy word line DWL2, and the pass voltage Vpass is applied to the first dummy word line DWL1 and the normal word lines WL0, ..., WL31. After the programming, whether the threshold voltage of the second dummy memory cell DC2 is greater than or equal to a second voltage Vr2' is verified in S540. In S540, the second voltage Vr2' that is to be achieved by post-programming the second dummy memory cells DC2 is different from the first voltage Vr1'. The second voltage Vr2' is applied to the second dummy word line DWL2, and a fourth voltage Vread is applied to the first dummy word line DWL12 and the normal word lines WL0, ..., WL31.

If it is determined in S540 that the threshold voltage of the second dummy memory cell DC2 is not greater than or equal to the second voltage Vr2', the second dummy memory cell DC2 is post-programmed again in S530. If it is determined in S540 that the threshold voltage of the second dummy memory cell DC2 is greater than or equal to the second voltage Vr2', the normal memory cells C0, ..., C31 are post-programmed in S550.

Post-programming the normal memory cells C0, ..., C31 in S550 and verifying them in S560 can be performed in a similar manner as in the method of FIG. 2, and therefore, a description thereof will be omitted. In an embodiment, third voltage Vr3' illustrated in FIG. 6 is equal to the second voltage Vr2 of FIG. 2.

In the method of FIG. 5, the first dummy memory cell DC1, the second dummy memory cell DC2, and the normal memory cells are sequentially post-programmed and verified, but it would be obvious to those of ordinary skill in the art that the same effect can be obtained even if the sequence of post-programming and verifying is changed.

Figure 7:
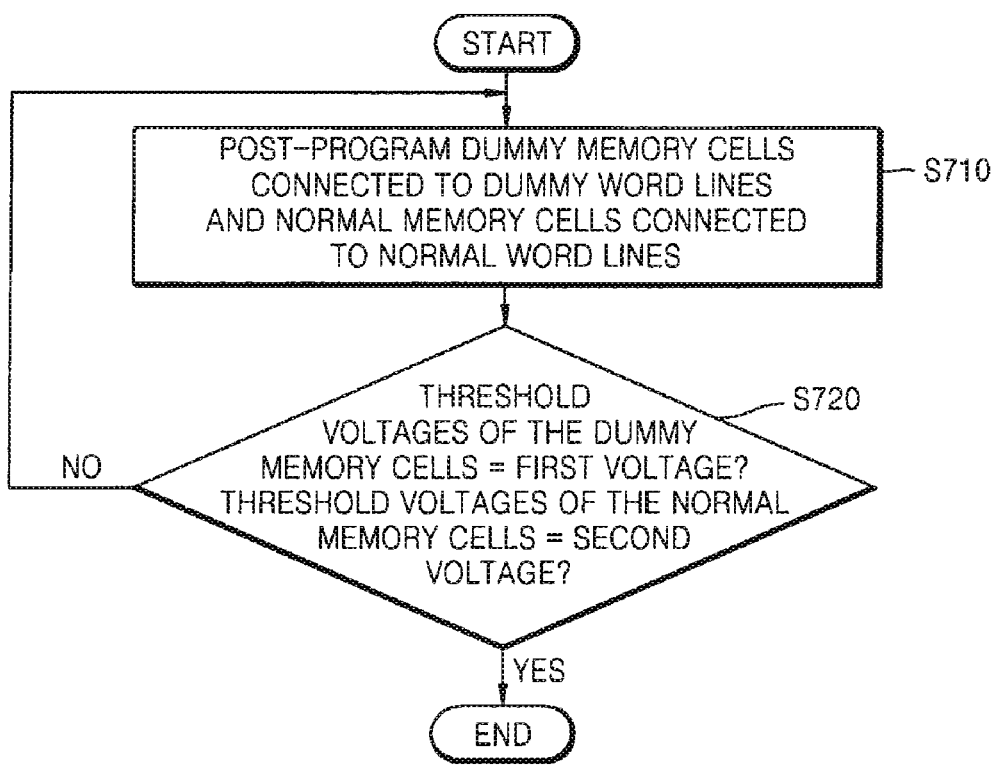
FIG. 7 is a flowchart illustrating a method of erasing in a nonvolatile memory device according to another embodiment.

FIG. 7 is a flowchart illustrating a method of erasing in a nonvolatile memory device according to another embodiment. Referring to FIGS. 1, 3, and 7, in the method of FIG. 7, the normal memory cells C0, ..., C31 and the dummy memory cells DC1, DC2 can be simultaneously post-programmed in S710. For example, the program voltage Vpgm is applied to the dummy word lines DWL1, DWL2 and the normal word lines WL0, ..., WL31.

After the post-programming, whether the dummy memory cells DC1, DC2 and the normal memory cells C0, ..., C31 were successfully programmed is verified in S720. For example, it is verified whether the threshold voltages of the dummy memory cells DC1, DC2 are greater than or equal to a first voltage Vr1 and whether the threshold voltages of the normal memory cells C0, ..., C31 are greater than or equal to a second voltage Vr2. To verify the dummy memory cells DC1, DC2, the first voltage Vr1 is applied to the dummy word lines DWL1, DWL2 and a third voltage Vread is applied to the normal word lines WL0, ..., WL31. In order to verify the normal memory cells C0, ..., C31, the second voltage Vr2 is applied to the normal word lines WL0, ..., WL31 and the third voltage Vread is applied to the dummy word lines DWL1, DWL2.

If it is determined in S720 that some of the memory cells do not have threshold voltages greater than or equal to the desired threshold voltage, those memory cells can be post-programmed again. That is, in S730, the memory cells that were not verified in S720 are post-programmed again. In S740, the memory cells post-programmed in S730 are verified again to determine if the memory cells post-programmed in S730 have threshold voltages greater than or equal to the desired threshold voltages. Depending on the verification in S740, memory cells the do not have threshold voltages greater than or equal to the desired threshold voltage can be again post-programmed in S730 and verified in S740.

In an embodiment, the memory cells that are post-programmed again in S730 can be grouped according to the type of memory cell. For example, if it is determined in S720 that the threshold voltages of the dummy memory cells DC1, DC2 are greater than or equal to the first voltage Vr1, but at least one of the normal memory cells C0, ..., C31 has a threshold voltage that is not greater than or equal to the second voltage Vr2, then only the normal memory cells C0, ..., C31 would be post-programmed again in S730. Similarly, if only the dummy memory cell DC1 has a threshold voltage that was not greater than the first voltage Vr1, then only the dummy memory cell DC1 would be post-programmed again in S730.

As a result, only the memory cells with low threshold voltages would be post-programmed again. Moreover, memory cells that are subsequently post-programmed in S730 successfully need not be post-programmed. For example, in a first performance of S730, the dummy memory cell DC1 and the normal memory cells C0, ..., C31 are post-programmed. However, if the normal memory cells C0, ..., C31 were successfully post-programmed but the dummy memory cell DC1 was not successfully post-programmed, only the dummy memory cell DC1 would be post-programmed again in a second performance of S730.

Figure 8:
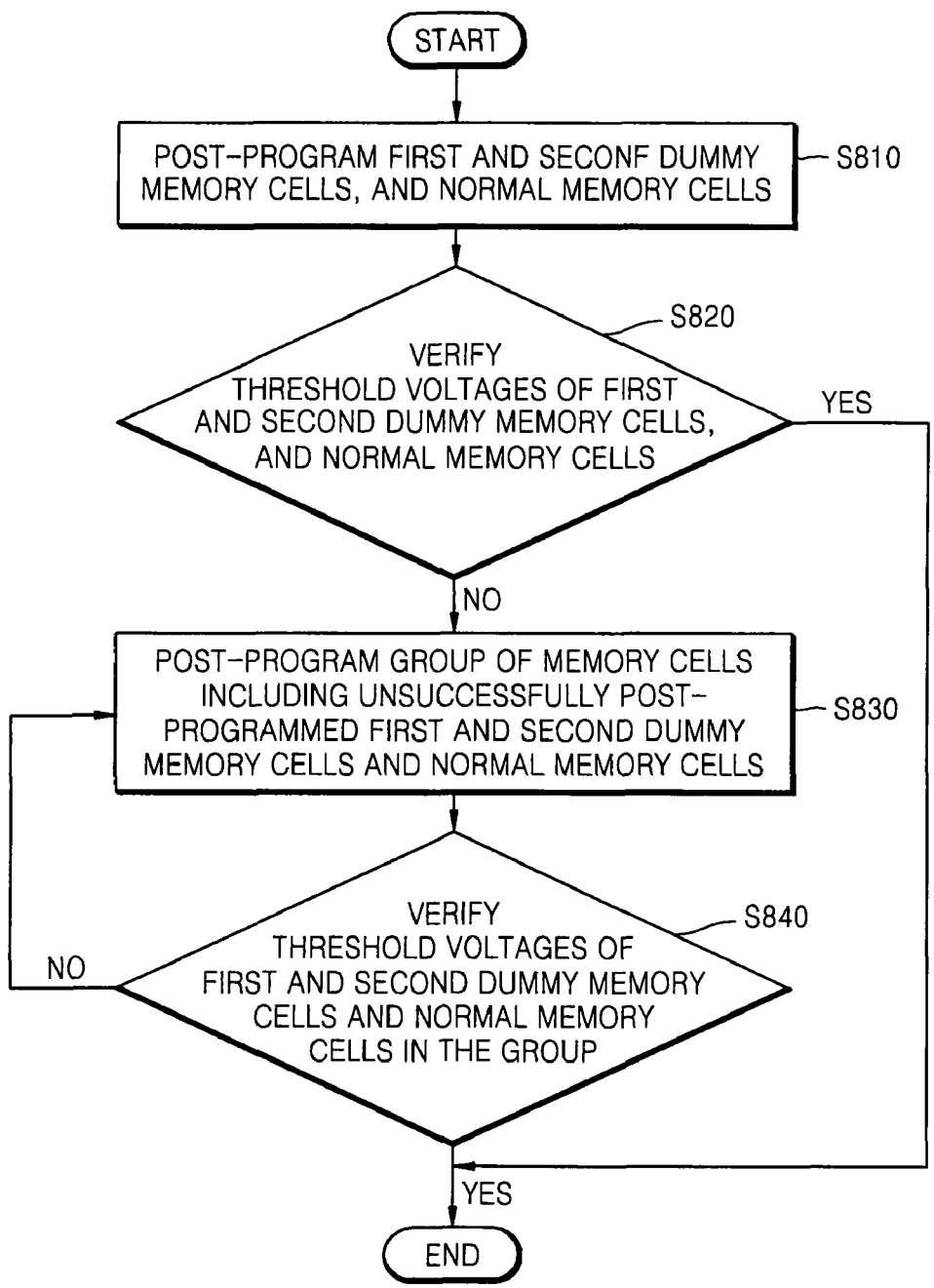
FIG. 8 is a flowchart illustrating a method of erasing in a nonvolatile memory device according to another embodiment.

FIG. 8 is a flowchart illustrating a method of erasing in a nonvolatile memory device according to another embodiment. Referring to FIGS. 1 and 6 through 8, in the method of FIG. 8, post-programming is performed so that each of the dummy memory cells DC1, DC2 can have different threshold voltages. Similar to the embodiment described above with reference to FIG. 7, the normal memory cells C0, ..., C31, the first dummy memory cell DC1 and the second dummy memory cell DC2 are post-programmed at the same time in S810. However, in this embodiment, the first dummy memory cell DC1 and the second dummy memory cell DC2 are post-programmed to have threshold voltages greater than or equal to a first voltage Vr1' and a second voltage Vr2', respectively.

Similar to S720, whether the first dummy memory cell DC1, the second dummy memory cell DC2 and the normal memory cells C0, ..., C31 were successfully post-programmed is verified in S820. For example, it is determined whether the threshold voltage of the first dummy memory cell DC1 is greater than or equal to the first voltage Vr1', whether the threshold voltage of the second dummy memory cell DC2 is greater than or equal to the second voltage Vr2', and whether the threshold voltage of the normal memory cells C0, ..., C31 are greater than or equal to a third voltage Vr3'. In an embodiment, the second voltage Vr2' that is to be achieved by post-programming the second dummy memory cell DC2 is different from the first voltage Vr1'. The third voltage Vr3' can be equal to the second voltage Vr2 described above with reference to FIG. 3.

Similar to S730, if it is determined in S820 that memory cells whose threshold voltages are not greater than or equal to the associated first, second or third voltage Vr1', Vr2' or Vr3', those memory cells can be post-programmed again in S830. The memory cells post-programmed in S830 can be verified in S740. However, the post-programming in S830 and the verification in S840 are different in that a different threshold voltage can be used for each of the dummy memory cells DC1 and DC2. Similar to S730 and S740, S830 and S840 can be repeated with memory cells that were not successfully post-programmed.

Figure 9A:
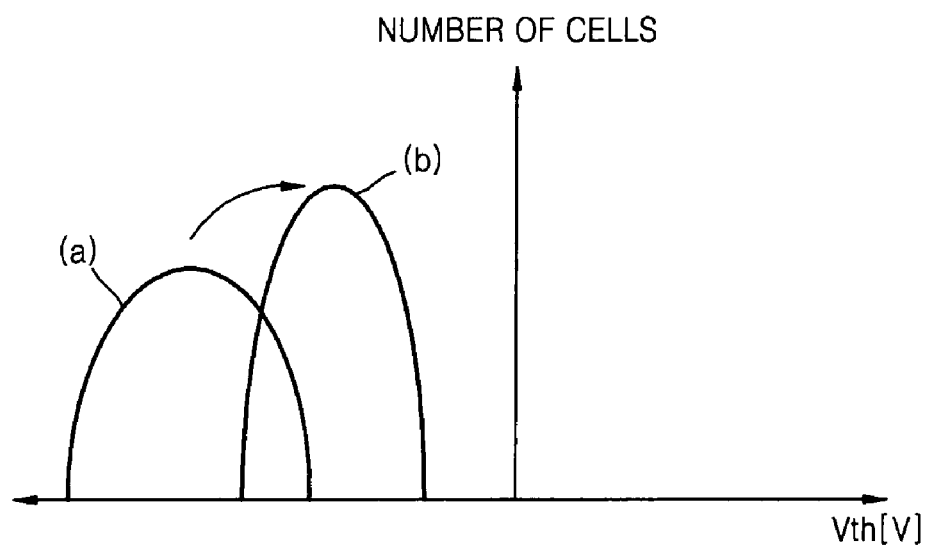
FIG. 9A is a graph illustrating distribution of the threshold voltage of a memory cell according to a conventional method.

FIG. 9A is a graph illustrating distribution of the threshold voltage Vth of a memory cell according to a conventional method. Referring to FIGS. 1 and 9A, after main-erasing, the threshold voltages Vth of the normal memory cells C0, ..., C31 and the dummy memory cells DC1, DC2 have a distribution as indicted with (a). Since conventionally, post-programming is indiscriminately performed on the normal memory cells C0, ..., C31 and the dummy memory cells DC1, DC2, the distribution of the threshold voltages Vth of the normal memory cells C0, ..., C31 and the dummy memory cells DC1, DC2 changes as indicated with (b) after the post-programming.

Figure 9B:
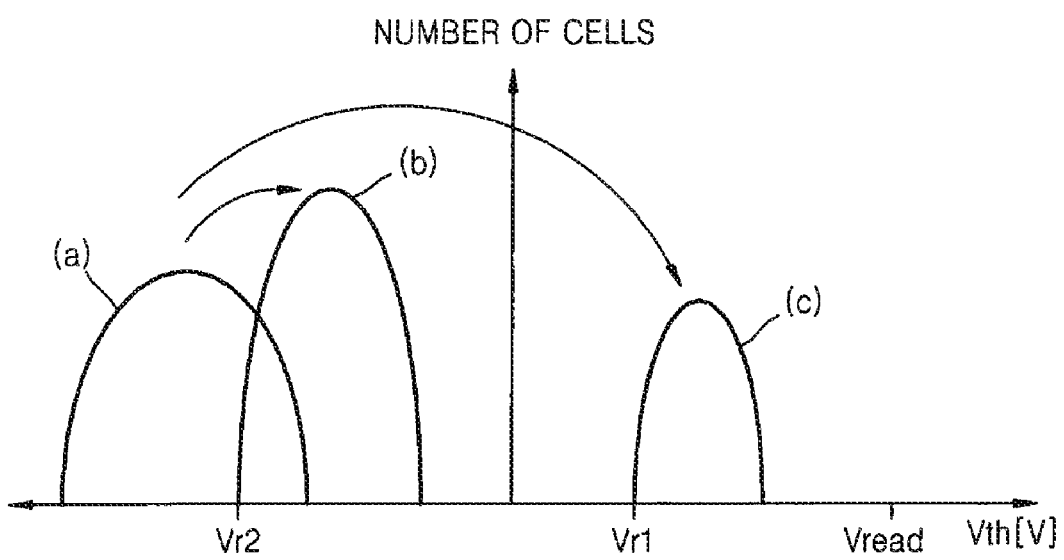
FIG. 9B is a diagram illustrating distribution of the threshold voltage of a memory cell according to the method of FIG. 2, 4 or 7.

FIG. 9B is a diagram illustrating an example of a distribution of threshold voltage Vth of a memory cell according to the method of FIG. 2, 4 or 7, according to an embodiment. In this case, referring to FIGS. 1 and 9B, after main-erasing, the normal memory cells C0, ..., C31 and the dummy memory cells DC1, DC2 have a distribution as indicated with (a), similar to (a) of FIG. 9A. However, in the current embodiment, since the normal memory cells C0, ..., C31 and the dummy memory cells DC1, DC2 are individually post-programmed, the distribution of the threshold voltages Vth of the normal memory cells C0, ..., C31 change as indicated with (b) after the post-programming. Also, the threshold voltages Vth of the dummy memory cells DC1, DC2 change as indicated with (c).

Figure 9C:
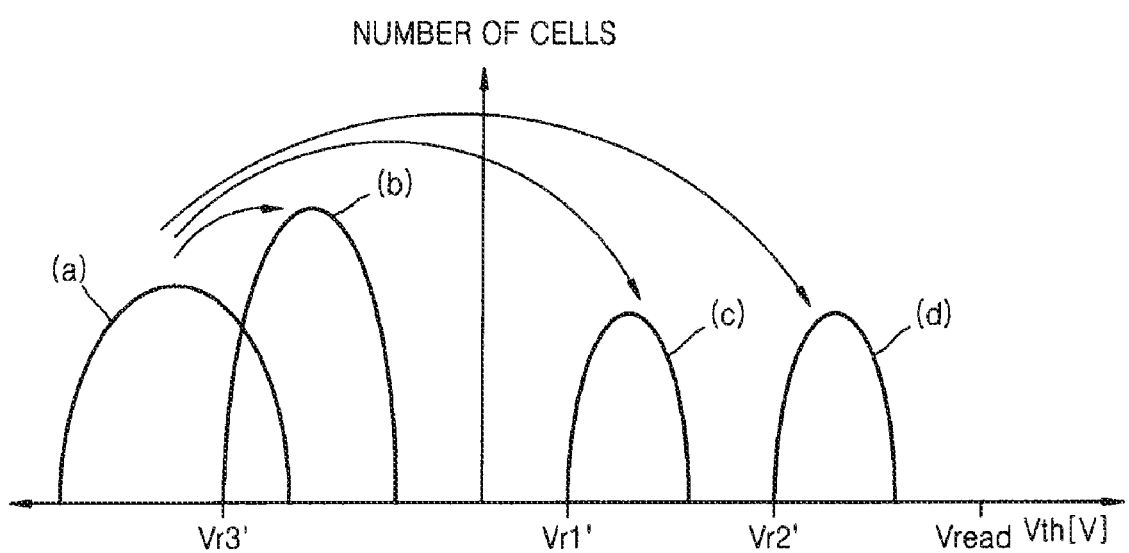
FIG. 9C is a diagram illustrating distribution of the threshold voltage of a memory cell according to the method of FIG. 5 or 8.

FIG. 9C is a diagram illustrating an example of a distribution of the threshold voltage Vth of a memory cell according to the method of FIG. 5 or 8, according to another embodiment. Referring to FIGS. 1 and 9C, after main-erasing, the normal memory cells C0, ..., C31 an the dummy memory cells DC1, DC2 have a distribution as illustrated with (a), similar to (a) of FIG. 9A. However, in this embodiment, since the normal memory cells C0, ..., C31, the first dummy memory cell DC1 and the second dummy memory cell DC2 are individually post-programmed, the distribution of the threshold voltages Vth of the normal memory cells C0, ..., C31 changes as indicated with (b) after the post-programming. Also, the distribution of the threshold voltage Vth of the first dummy memory cell DC1 changes as indicated with (c), and the distribution of the threshold voltage Vth of the second dummy memory cell DC2 changes as indicated with (d).

As described above, in a method of erasing in a nonvolatile memory device according to an embodiment, normal memory cells connected to normal word lines and dummy memory cells connected to dummy word lines are individually post-programmed. Thus, junction potential increases thus improving the reliability of cell and preventing normal memory cells from being programmed due to turning on of dummy memory cells.

Another embodiment includes a method of erasing in a non-volatile memory device by individually performing post-programming normal memory cells connected to normal word lines and dummy memory cells connected to dummy word lines.

Another embodiment includes an erasing method of post-programming in a nonvolatile memory device having multiple normal word lines and multiple dummy word lines. The method includes post-programming dummy memory cells connected to the dummy word lines; verifying whether threshold voltages of the dummy memory cells are greater than or equal to a first voltage; post-programming normal memory cells connected to the normal word lines; and verifying whether threshold voltages of the normal memory cells are greater than or equal to a second voltage. The first voltage is different from the second voltage. In an embodiment, the first voltage may be higher than the second voltage.

If it is determined that the threshold voltages of the dummy memory cells are not greater than or equal to the first voltage, the dummy memory cells may be post-programmed again. If it is determined that the threshold voltages of the normal memory cells are not greater than or equal to the second voltage, the normal memory cells may be post-programmed again.

The post-programming of the dummy memory cells may include applying a program voltage to the dummy word lines so that dummy memory cells are post-programmed; and applying a pass voltage to the normal word lines so that the normal memory cells are not post-programmed.

The post-programming of the normal memory cells may include applying a program voltage to the normal word lines so that the normal memory cells are post-programmed; and applying a pass voltage to the dummy word lines so that the dummy memory cells are not post-programmed.

The verifying of whether threshold voltages of the dummy memory cells are greater than or equal to a first voltage may include applying the first voltage to the dummy word lines; and applying a third voltage to the normal word lines. The third voltage is higher than the first and second voltages.

The verifying of whether threshold voltages of the normal memory cells are greater than or equal to a second voltage may include applying the second voltage to the normal word lines; and applying a third voltage to the dummy word lines. Wherein the third voltage is higher than the first and second voltages.

Another embodiment includes an erasing method of post-programming in a nonvolatile memory device having multiple normal word lines and multiple dummy word lines. The method includes post-programming normal memory cells connected to the normal word lines; verifying whether threshold voltages of the normal memory cells are greater than or equal to a second voltage; post-programming dummy memory cells connected to the dummy word lines; and verifying whether threshold voltages of the dummy memory cells are greater than or equal to a first voltage. Wherein the first voltage is different from the second voltage.

Another embodiment includes an erasing method of post-programming in a nonvolatile memory device having multiple normal word lines, a first dummy word line and a second dummy word line. The method includes post-programming a first dummy memory cell connected to the first dummy word line; verifying whether a threshold voltage of the first dummy memory cell is greater than or equal to a first voltage; post-programming a second dummy memory cell connected to the second dummy word line; verifying whether a threshold voltage of the second dummy memory cell is greater than or equal to a second voltage; post-programming normal memory cells connected to the normal word lines; and verifying whether threshold voltages of the normal memory cells are greater than or equal to a third voltage. The third voltage is different from the first and second voltages.

Another embodiment includes an erasing method of post-programming in a nonvolatile memory device having multiple normal word lines and multiple dummy word lines. The method includes post-programming normal memory cells connected to the normal word lines and dummy memory cells connected to the dummy word lines; verifying whether threshold voltages of the dummy memory cells are greater than or equal to a first voltage; and verifying whether threshold voltages of the normal memory cells are greater than or equal to a second voltage. The first voltage is different from the second voltage.

Another embodiment includes an erasing method of post-programming in a nonvolatile memory device having multiple normal word lines, a first dummy word line and a second dummy word line, the method comprising post-programming normal memory cells connected to the normal word lines, a first dummy memory cell connected to a first dummy word line, and a second dummy memory cell connected to the second dummy word line; verifying whether a threshold voltage of the first dummy memory cell is greater than or equal to a first voltage; verifying whether a threshold of the second dummy memory cell is greater than or equal to a second voltage; and verifying whether threshold voltages of the normal memory cells are greater than or equal to a third voltage. The third voltage is different from the first and second voltages.

Although a particular sequences of post-programming of dummy memory cells DC1 and DC2 and normal memory cells C0, . . . , C31 and the verification of the threshold voltages have been described above, the sequence can be varied as desired. For example, the first dummy memory cell DC1 can be post-programmed, then verified. Next, the second dummy memory cell DC2 and the normal memory cells C0, . . . , C31 can be post-programmed, followed by the verification of the threshold voltages of the second dummy memory cell DC2 and the normal memory cells C0, . . . , C31. Any combination of post-programming and subsequent verification can be performed.

While embodiments have been particularly shown and described with reference to the drawings, it will be understood by those of ordinary skill in the art that various changes in form and details may be made therein without departing from the spirit and scope as defined by the following claims.

What is claimed is:

1. An erasing method in a nonvolatile memory device, the method comprising:
   post-programming dummy memory cells;
   verifying threshold voltages of the dummy memory cells using a first voltage;
   post-programming normal memory cells; and
   verifying threshold voltages of the normal memory cells using a second voltage;
   wherein the first voltage is different from the second voltage, and
   wherein the post-programming of the dummy memory cells comprises:
      applying a program voltage to a plurality of dummy word lines coupled to the dummy memory cells to post-program the dummy memory cells; and
      applying a pass voltage to a plurality of normal word lines coupled to the normal memory cells so that the normal memory cells are not post-programmed.

2. The erasing method of claim 1, wherein the first voltage is higher than the second voltage.

3. The erasing method of claim 1, further comprising if the threshold voltages of the dummy memory cells are not verified as greater than or equal to the first voltage, post-programming the dummy memory cells again.

4. The erasing method of claim 1, further comprising if the threshold voltages of the normal memory cells are not verified as greater than or equal to the second voltage, post-programming the normal memory cells again.

5. The erasing method of claim 1, wherein the program voltage is 25 volts, and the pass voltage is 8 volts.

6. The erasing method of claim 1, wherein the post-programming of the normal memory cells comprises:
   applying a program voltage to a plurality of normal word lines coupled to the normal memory cells to post-program the normal memory cells; and
   applying a pass voltage to a plurality of dummy word lines coupled to the dummy memory cells so that the dummy memory cells are not post-programmed.

7. The erasing method of claim 1, wherein the verifying of the threshold voltages of the dummy memory cells comprises:
   applying the first voltage to a plurality of dummy word lines coupled to the dummy memory cells; and
   applying a third voltage to a plurality of normal word lines coupled to the normal memory cells;
   wherein the third voltage is higher than the first and second voltages.

8. The erasing method of claim 1, wherein the verifying of the threshold voltages of the normal memory cells comprises:
   applying the second voltage to a plurality of normal word lines coupled to the normal memory cells; and
   applying a third voltage to a plurality of dummy word lines coupled to the dummy memory cells,
   wherein the third voltage is higher than the first and second voltages.

9. The erasing method of claim 1, wherein the post-programming of the normal memory cells and the verifying of the threshold voltages of the normal memory cells are performed before the post-programming of the dummy memory cells and the verifying of the threshold voltages of the dummy memory cells.

10. The erasing method of claim 1, wherein the post-programming of the dummy memory cells and the verifying of the threshold voltages of the dummy memory cells are performed before the post-programming of the normal memory cells and the verifying of the threshold voltages of the normal memory cells.

11. The erasing method of claim 1, wherein the post-programming of the dummy memory cells and the post-programming of the normal memory cells are performed before the verifying of the threshold voltages of the dummy memory cells and the verifying of the threshold voltages of the normal memory cells.

12. An erasing method in a nonvolatile memory device, the method comprising:
   post-programming a first dummy memory cell;
   verifying a threshold voltage of the first dummy memory cell using a first voltage;
   post-programming a second dummy memory cell;
   verifying a threshold voltage of the second dummy memory cell using a second voltage;
   post-programming normal memory cells; and
   verifying threshold voltages of the normal memory cells using a third voltage;
   wherein the third voltage is different from the first and second voltages, and
   wherein the post-programming of the first dummy memory cell comprises:

applying a program voltage to a first dummy word line coupled to the first dummy memory cell to post-program the first dummy memory cell; and applying a pass voltage to a second dummy word line coupled to the second dummy memory cell and a plurality of normal word lines coupled to the normal memory cells so that the second dummy memory cell and the normal memory cells are not post-programmed.

13. The erasing method of claim 12, further comprising if the threshold voltage of the first dummy memory cell is not verified as greater than or equal to the first voltage, post-programming the first dummy memory cell again.

14. The erasing method of claim 12, further comprising if the threshold voltage of the second dummy memory cell is not verified as greater than or equal to the second voltage, post-programming the second dummy memory cell again.

15. The erasing method of claim 12, further comprising if the threshold voltages of the normal memory cells are not verified as greater than or equal to the third voltage, post-programming the normal memory cells again.

16. The erasing method of claim 12, wherein the program voltage is 25 volts, and the pass voltage is 8 volts.

17. The erasing method of claim 12, wherein the post-programming of the second dummy memory cell comprises:
applying a program voltage to a second dummy word line coupled to the second dummy memory cell to post-program the second dummy memory cell; and
applying a pass voltage to a first dummy word line coupled to the first dummy memory cell and a plurality of normal word lines coupled to the normal memory cells so that the first dummy memory cell and the normal memory cells are not post-programmed.

18. The erasing method of claim 12, wherein the post-programming of the normal memory cells comprises:
applying a program voltage to a plurality of normal word lines to post-program the normal memory cells; and
applying a pass voltage to a first dummy word line coupled to the first dummy memory cell and a second dummy word line coupled to the second dummy memory cell so that the first dummy memory cell and the second dummy memory cell are not post-programmed.

19. The erasing method of claim 12, wherein:
the verifying of the threshold voltage of the first dummy memory cell comprises:
applying the first voltage to a first dummy word line coupled to the first dummy memory cell; and
applying a fourth voltage to a second dummy word line coupled to the second dummy memory cell and a plurality of normal word lines coupled to the normal memory cells;
the verifying of the threshold voltage of the second dummy memory cell comprises:
applying the second voltage to the second dummy word line; and
applying the fourth voltage to the first dummy word line and the normal word lines;

the verifying of the threshold voltages of the normal memory cells comprises:
applying the third voltage to the normal word lines; and
applying the fourth voltage to the first dummy word line and the second dummy word line; and the fourth voltage is higher than the first through third voltages.

20. An erasing method in a nonvolatile memory device, the method comprising:
post-programming dummy memory cells;
post-programming normal memory cells;
verifying threshold voltages of the dummy memory cells using at least one corresponding first voltage;
verifying threshold voltages of the normal memory cells using a second voltage; and
post-programming a group of memory cells including dummy memory cells having threshold voltages that were not verified and normal memory cells having threshold voltages that were not verified,
wherein each of the at least one corresponding first voltage is different from the second voltage.

21. The erasing method of claim 20, wherein post-programming the group of memory cells comprises:
post-programming a first group of memory cells without post-programming a second group of memory cells;
wherein the first group includes all dummy memory cells if any of the dummy memory cells were not verified as having threshold voltages greater than or equal to the at least one corresponding first voltage, and includes all normal memory cells if any of the normal memory cells were not verified as having threshold voltages greater than or equal to the second voltage.

22. The erasing method of claim 20, wherein post-programming the group of memory cells comprises:
post-programming a first group of memory cells without post-programming a second group of memory cells;
wherein the first group includes each dummy memory cell only if that dummy memory cell was not verified as having threshold voltages greater than or equal to its corresponding first voltage, and includes all normal memory cells if any of the normal memory cells were not verified as having threshold voltages greater than or equal to the second voltage.

23. The erasing method of claim 22, wherein the post-programming the first group of memory cells without post-programming the second group of memory cells comprises:
applying a program voltage to word lines coupled to the first group of memory cells; and
applying a pass voltage to word lines coupled to the second group of memory cells.

24. The erasing method of claim 20, further comprising:
post-programming a subsequent group of memory cells including dummy memory cells that were not verified as having threshold voltages greater than or equal to the at least one corresponding first voltage and normal memory cells that were not verified as having threshold voltages greater than or equal to the second voltage.

\* \* \* \* \*